United States Patent
Hermanussen et al.

(10) Patent No.: US 11,880,144 B2
(45) Date of Patent: Jan. 23, 2024

(54) OBJECT TABLE, A STAGE APPARATUS AND A LITHOGRAPHIC APPARATUS

(71) Applicant: ASML NETHERLANDS B.V., Veldhoven (NL)

(72) Inventors: Sander Jeroen Hermanussen, Tilburg (NL); Johannes Petrus Martinus Bernardus Vermeulen, Leende (NL); Hans Butler, Best (NL); Bas Jansen, Den Bosch (NL); Michael Marinus Anna Steur, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 84 days.

(21) Appl. No.: 17/603,812

(22) PCT Filed: Mar. 25, 2020

(86) PCT No.: PCT/EP2020/058276
§ 371 (c)(1),
(2) Date: Oct. 14, 2021

(87) PCT Pub. No.: WO2020/216555
PCT Pub. Date: Oct. 29, 2020

(65) Prior Publication Data
US 2022/0197155 A1    Jun. 23, 2022

(30) Foreign Application Priority Data

Apr. 23, 2019 (EP) ................................... 19170605
Dec. 19, 2019 (EP) ................................... 19218254

(51) Int. Cl.
G03F 7/00 (2006.01)
H01L 21/687 (2006.01)

(52) U.S. Cl.
CPC ...... *G03F 7/70725* (2013.01); *G03F 7/70708* (2013.01); *G03F 7/70783* (2013.01);
(Continued)

(58) Field of Classification Search
CPC .................................................. G03F 7/70783
See application file for complete search history.

(56) References Cited

U.S. PATENT DOCUMENTS 4,385,434 A * 5/1983 Zehnpfennig .......... B23Q 1/032
378/34
4,506,184 A    3/1985 Siddall
(Continued)

FOREIGN PATENT DOCUMENTS

JP    06208942 A * 7/1994 ......... G03F 7/70783
JP    H06208942     7/1994

OTHER PUBLICATIONS

Translation of JP-06208942-A (Year: 1994).*
(Continued)

*Primary Examiner* — Steven Whitesell Gordon
(74) *Attorney, Agent, or Firm* — Pillsbury Winthrop Shaw Pittman, LLP

(57) ABSTRACT

An object table configured to hold an object on a holding surface, the object table including: a main body; a plurality of burls extending from the main body, end surfaces of the burls defining the holding surface; an actuator assembly; and a further actuator assembly, wherein the actuator assembly is configured to deform the main body to generate a long stroke out-of-plane deformation of the holding surface based on shape information of the object that is to be held and the further actuator assembly is configured to generate a short stroke out-of-plane deformation of the holding surface.

20 Claims, 10 Drawing Sheets

(52) U.S. Cl.
CPC .... *H01L 21/6875* (2013.01); *H01L 21/68735* (2013.01); *H01L 21/68785* (2013.01)

(56) References Cited

U.S. PATENT DOCUMENTS

| | | | |
|---|---|---|---|
| 6,020,964 | A | 2/2000 | Loopstra et al. |
| 6,229,595 | B1 | 5/2001 | McKinley et al. |
| 6,952,253 | B2 | 10/2005 | Lof et al. |
| 2007/0058173 | A1 | 3/2007 | Holzapfel |
| 2009/0201477 | A1 | 8/2009 | Butler |
| 2012/0026480 | A1 | 2/2012 | Loopstra et al. |
| 2013/0162968 | A1* | 6/2013 | De Groot ............ G03F 7/70758 355/72 |
| 2014/0320841 | A1* | 10/2014 | Muraki ............... G03F 7/70708 355/73 |
| 2018/0188660 | A1 | 7/2018 | Poiesz |
| 2018/0316285 | A1 | 11/2018 | Marth et al. |

OTHER PUBLICATIONS

International Search Report and Written Opinion issued in corresponding PCT Patent Application No. PCT/EP2020/058276, dated Jul. 8, 2020.

\* cited by examiner

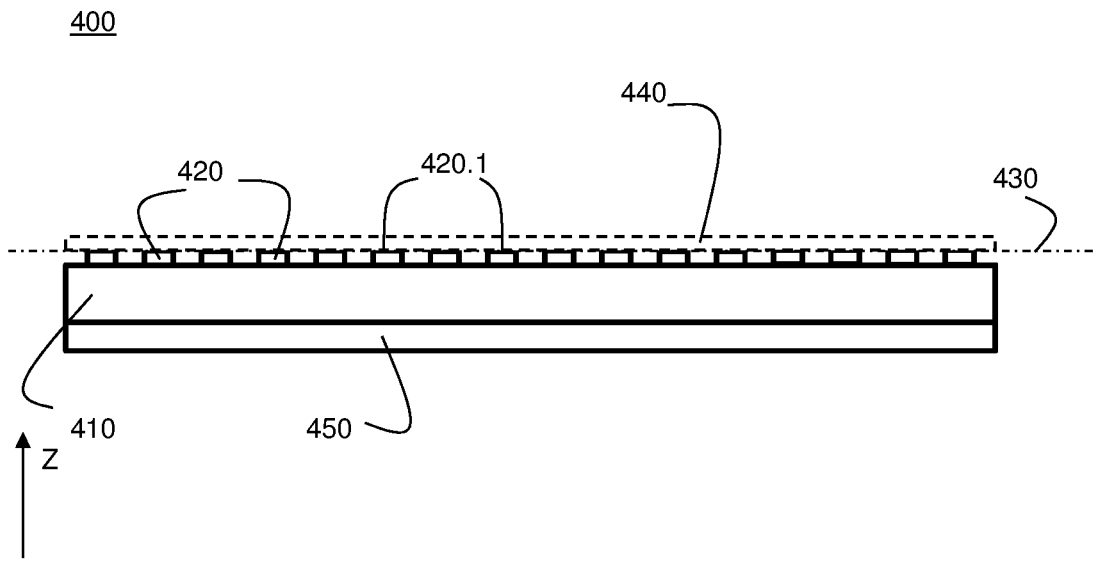
Fig. 4
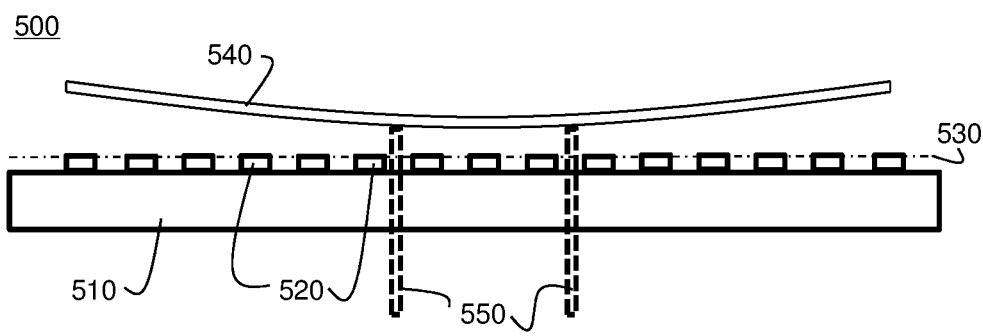
Fig. 5 (a1)
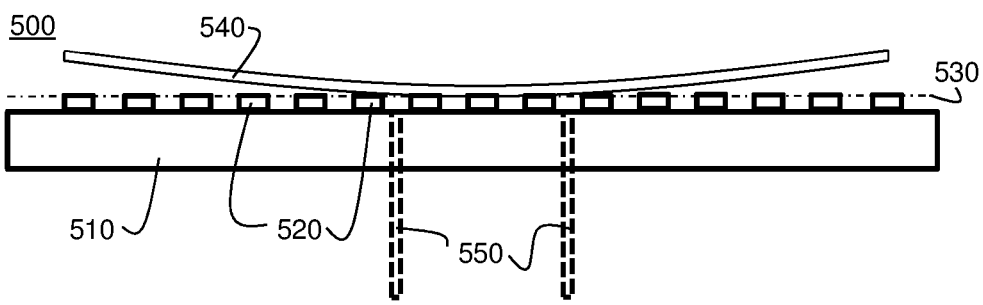
Fig. 5 (a2)

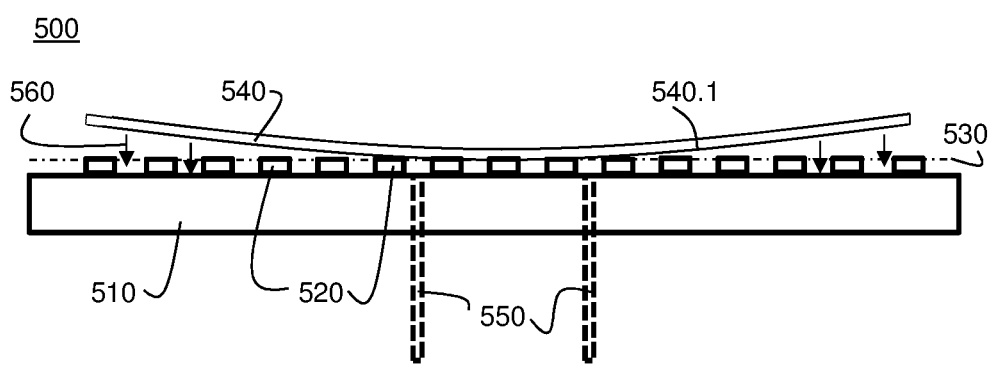
Fig. 5 (b1)
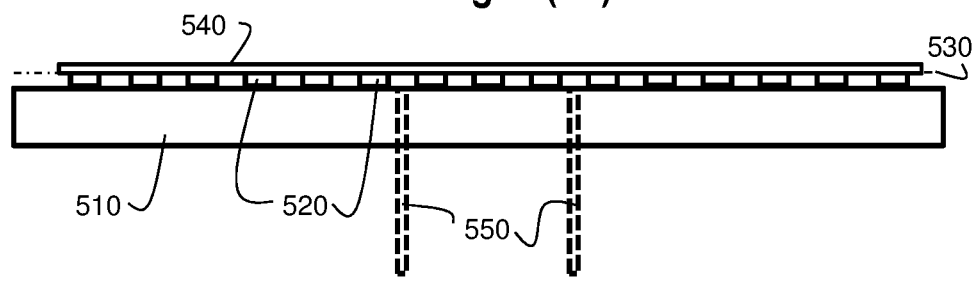
Fig. 5 (b2)

OBJECT TABLE, A STAGE APPARATUS AND A LITHOGRAPHIC APPARATUS

CROSS-REFERENCE TO RELATED APPLICATION

The application is the U.S. national phase entry of PCT Patent Application No. PCT/EP2020/058276 which was filed on Mar. 25, 2020, which claims the benefit of priority of European Patent Application No. 19170605.0 which was filed on Apr. 23, 2019 and European Patent Application No. 19218254.1 which was filed on Dec. 19, 2019 and which are incorporated herein in their entireties by reference.

FIELD

The present invention relates to an object table, a stage apparatus, a lithographic apparatus and a method of loading an object onto an object table or stage apparatus.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as 'Moore's law'. To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on a substrate than a lithographic apparatus which uses, for example, radiation with a wavelength of 193 nm.

During the patterning of the substrate, the substrate is typically held or clamped on a substrate table. Such an object table may e.g. comprise a plurality of burls for supporting the substrate. In case the bottom surface of the substrate is not flat, which unflatness may have various causes, the clamping of the substrate onto the substrate table may cause an unwanted deformation of the substrate. Such a deformation may adversely affect the patterning accuracy, in particular the accuracy with which consecutive patterned layers can be aligned. This may result in a yield loss of the patterning process.

SUMMARY

It is an object of the present invention to provide an object table that enables holding an object such as a substrate in such manner that a deformation of the substrate due to a clamping is avoided or at least mitigated. It is an object of the present invention to provide an object table that enables loading an object such as a substrate in such manner that a relative motion between object table and object during loading and while in contact is avoided or at least mitigated such that wear of the object table and friction induced deformation of the substrate due to a clamping is avoided or at least mitigated.

According to an aspect of the invention, there is provided an object table configured to hold an object on a holding surface, the object table comprising:
a main body;
a plurality of burls extending from the main body, end surfaces of the burls defining the holding surface;
an actuator assembly;
wherein the actuator assembly is configured to deform the main body to generate an out-of-plane deformation of the holding surface, based on shape information of the object that is to be held.

According to another aspect of the invention, there is provided a method of holding an object by an object table, the method comprising the steps of:
providing the object that is to be held in the vicinity of an holding surface of the object table;
deforming a main body of the object table to generate an out-of-plane deformation of the holding surface, in accordance with shape information of the object that is to be held;
exerting a holding force on the object to hold the object on the object table.

BRIEF DESCRIPTION OF THE DRAWINGS

Embodiments of the invention will now be described, by way of example only, with reference to the accompanying schematic drawings, in which:

FIG. 4 depicts an embodiment of an object table according to the present invention;

FIG. 5 schematically depict a loading sequence as known in the art;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
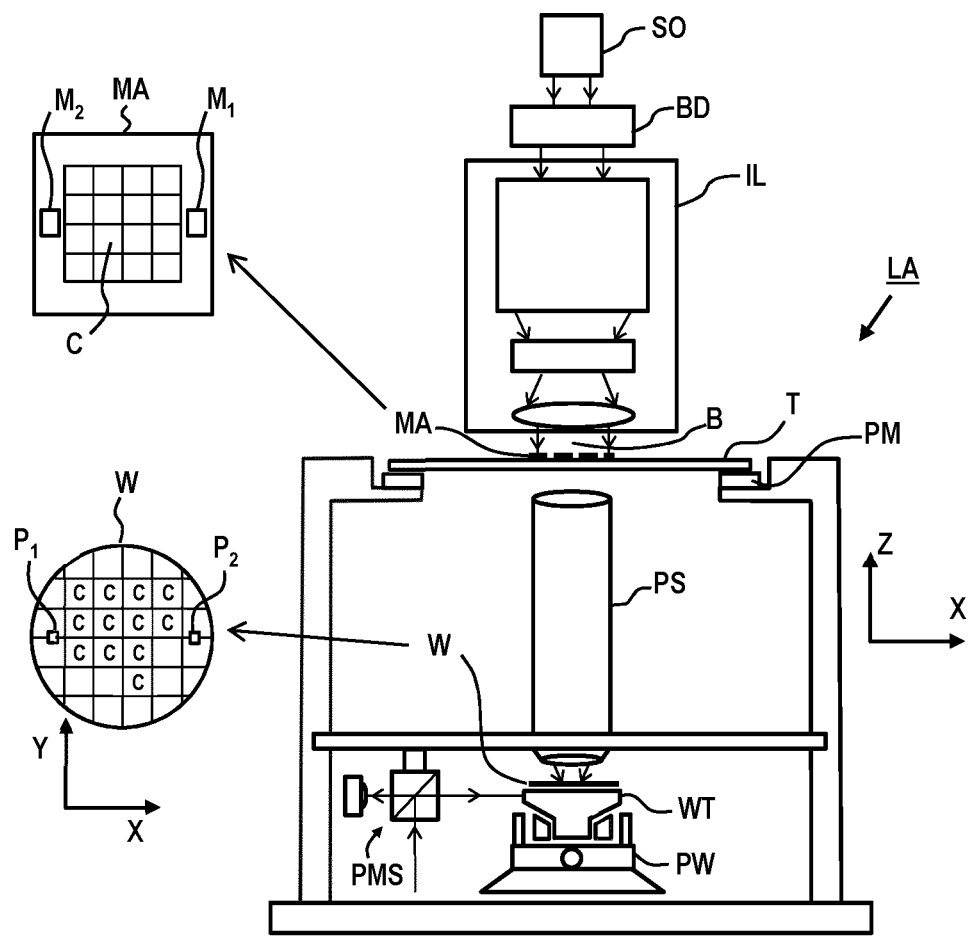
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W. The substrate support WT may e.g. include an object table according to the present invention for holding the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports
WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the patterning device MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

To clarify the invention, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

Figure 2:
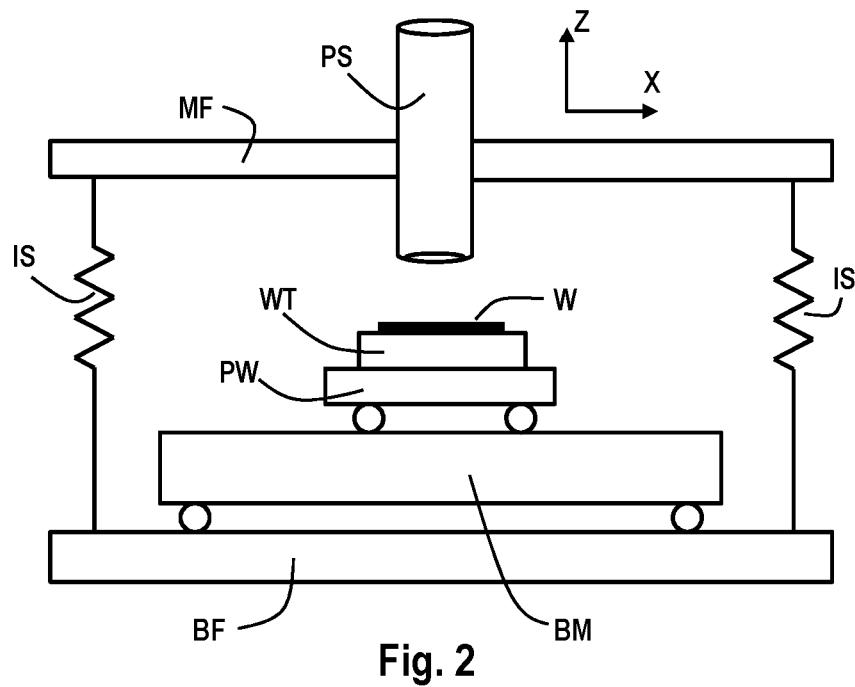
FIG. 2 depicts a detailed view of a part of the lithographic apparatus of FIG. 1.

FIG. 2 shows a more detailed view of a part of the lithographic apparatus LA of FIG. 1. The lithographic apparatus LA may be provided with a base frame BF, a balance mass BM, a metrology frame MF and a vibration isolation system IS. The metrology frame MF supports the projection system PS. Additionally, the metrology frame MF may support a part of the position measurement system PMS. The metrology frame MF is supported by the base frame BF via the vibration isolation system IS. The vibration isolation system IS is arranged to prevent or reduce vibrations from propagating from the base frame BF to the metrology frame MF.

The second positioner PW is arranged to accelerate the substrate support WT by providing a driving force between the substrate support WT and the balance mass BM. The driving force accelerates the substrate support WT in a desired direction. Due to the conservation of momentum, the driving force is also applied to the balance mass BM with equal magnitude, but at a direction opposite to the desired direction. Typically, the mass of the balance mass BM is significantly larger than the masses of the moving part of the second positioner PW and the substrate support WT.

In an embodiment, the second positioner PW is supported by the balance mass BM. For example, wherein the second positioner PW comprises a planar motor to levitate the substrate support WT above the balance mass BM. In another embodiment, the second positioner PW is supported by the base frame BF. For example, wherein the second positioner PW comprises a linear motor and wherein the second positioner PW comprises a bearing, like a gas bearing, to levitate the substrate support WT above the base frame BF.

The position measurement system PMS may comprise any type of sensor that is suitable to determine a position of the substrate support WT. The position measurement system PMS may comprise any type of sensor that is suitable to determine a position of the mask support MT. The sensor may be an optical sensor such as an interferometer or an encoder. The position measurement system PMS may comprise a combined system of an interferometer and an encoder. The sensor may be another type of sensor, such as a magnetic sensor. a capacitive sensor or an inductive sensor. The position measurement system PMS may determine the position relative to a reference, for example the metrology frame MF or the projection system PS. The position measurement system PMS may determine the position of the substrate table WT and/or the mask support MT by measuring the position or by measuring a time derivative of the position, such as velocity or acceleration.

The position measurement system PMS may comprise an encoder system. An encoder system is known from for example, United States patent application US2007/0058173A1, filed on Sep. 7, 2006, hereby incorporated by reference. The encoder system comprises an encoder head, a grating and a sensor. The encoder system may receive a primary radiation beam and a secondary radiation beam. Both the primary radiation beam as well as the secondary radiation beam originate from the same radiation beam, i.e., the original radiation beam. At least one of the primary radiation beam and the secondary radiation beam is created by diffracting the original radiation beam with the grating. If both the primary radiation beam and the secondary radiation beam are created by diffracting the original radiation beam with the grating, the primary radiation beam needs to have a different diffraction order than the secondary radiation beam. Different diffraction orders are, for example, $+1^{st}$ order, $-1^{st}$ order, $+2^{nd}$ order and $-2^{nd}$ order. The encoder system optically combines the primary radiation beam and the secondary radiation beam into a combined radiation beam. A sensor in the encoder head determines a phase or phase difference of the combined radiation beam. The sensor generates a signal based on the phase or phase difference. The signal is representative of a position of the encoder head relative to the grating. One of the encoder head and the grating may be arranged on the substrate structure WT. The other of the encoder head and the grating may be arranged on the metrology frame MF or the base frame BF. For example, a plurality of encoder heads are arranged on the metrology frame MF, whereas a grating is arranged on a top surface of the substrate support WT. In another example, a grating is arranged on a bottom surface of the substrate support WT, and an encoder head is arranged below the substrate support WT.

The position measurement system PMS may comprise an interferometer system. An interferometer system is known from, for example, U.S. Pat. No. 6,020,964, filed on Jul. 13, 1998, hereby incorporated by reference. The interferometer system may comprise a beam splitter, a mirror, a reference mirror and a sensor. A beam of radiation is split by the beam splitter into a reference beam and a measurement beam. The measurement beam propagates to the mirror and is reflected by the mirror back to the beam splitter. The reference beam propagates to the reference mirror and is reflected by the reference mirror back to the beam splitter. At the beam splitter, the measurement beam and the reference beam are combined into a combined radiation beam. The combined radiation beam is incident on the sensor. The sensor determines a phase or a frequency of the combined radiation beam. The sensor generates a signal based on the phase or the frequency. The signal is representative of a displacement of the mirror. In an embodiment, the mirror is connected to the substrate support WT. The reference mirror may be connected to the metrology frame MF. In an embodiment, the measurement beam and the reference beam are combined into a combined radiation beam by an additional optical component instead of the beam splitter.

The first positioner PM may comprise a long-stroke module and a short-stroke module. The short-stroke module is arranged to move the mask support MT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the first positioner PM is able to move the mask support MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a relatively low accuracy over a large range of movement. With the combination of the long-stroke module and the short-stroke module, the second positioner PW is able to move the substrate support WT relative to the projection system PS with a high accuracy over a large range of movement.

The first positioner PM and the second positioner PW each are provided with an actuator to move respectively the mask support MT and the substrate support WT. The actuator may be a linear actuator to provide a driving force along a single axis, for example the y-axis. Multiple linear actuators may be applied to provide driving forces along multiple axis. The actuator may be a planar actuator to provide a driving force along multiple axis. For example, the planar actuator may be arranged to move the substrate support WT in 6 degrees of freedom. The actuator may be an electro-magnetic actuator comprising at least one coil and at least one magnet. The actuator is arranged to move the at least one coil relative to the at least one magnet by applying an electrical current to the at least one coil. The actuator may be a moving-magnet type actuator, which has the at least one magnet coupled to the substrate support WT respectively to the mask support MT. The actuator may be a moving-coil type actuator which has the at least one coil coupled to the substrate support WT respectively to the mask support MT. The actuator may be a voice-coil actuator, a reluctance actuator, a Lorentz-actuator or a piezo-actuator, or any other suitable actuator.

Figure 3:
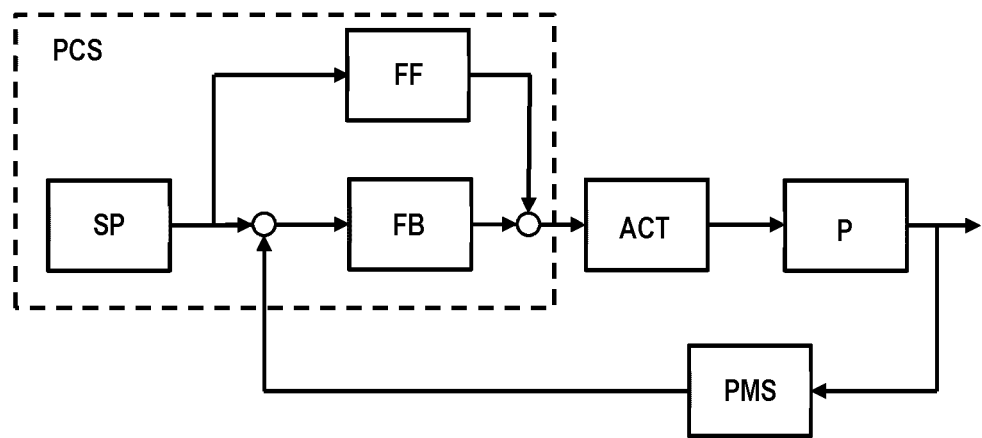
FIG. 3 schematically depicts a position control system.

The lithographic apparatus LA comprises a position control system PCS as schematically depicted in FIG. 3. The position control system PCS comprises a setpoint generator SP, a feedforward controller FF and a feedback controller FB. The position control system PCS provides a drive signal to the actuator ACT. The actuator ACT may be the actuator of the first positioner PM or the second positioner PW. The actuator ACT drives the plant P, which may comprise the substrate support WT or the mask support MT. An output of the plant P is a position quantity such as position or velocity or acceleration. The position quantity is measured with the position measurement system PMS. The position measurement system PMS generates a signal, which is a position signal representative of the position quantity of the plant P. The setpoint generator SP generates a signal, which is a reference signal representative of a desired position quantity of the plant P. For example, the reference signal represents a desired trajectory of the substrate support WT. A difference between the reference signal and the position signal forms an input for the feedback controller FB. Based on the input, the feedback controller FB provides at least part of the drive signal for the actuator ACT. The reference signal may form an input for the feedforward controller FF. Based on the input, the feedforward controller FF provides at least part of the drive signal for the actuator ACT. The feedforward FF may make use of information about dynamical characteristics of the plant P, such as mass, stiffness, resonance modes and eigenfrequencies.

FIG. 4 schematically shows an object table 400 according to the present invention. Such an object table 400 may e.g. be used to hold an object such as a substrate during processing. As an example of such processing, a lithographic patterning process can be mentioned. Within the meaning of the present invention, holding an object onto an object table refers to exerting a force, e.g. a distributed force, onto the object such that it is clamped to the object table.

In the embodiment as shown, the object table 400 comprises a main body 410 and a plurality of burls 420 extending from the main body 410. In the embodiment as shown, the end surfaces 420.1 of the burls 420 define a surface 430, also referred to as the holding surface, onto which an object 440 such as a substrate can be mounted or clamped, e.g. via vacuum or electrostatically. In order to do so, the object table 400 can be configured to exert a holding force on the object 430, said holding force being directed to pull the object 440 towards the surface 430, i.e. onto the end surfaces 420.1 of the burls 420. In the embodiment as shown, the object table 400 further comprises an actuator assembly 450. In accordance with the present invention, the actuator assembly 450 is configured to deform the main body 410 of the object table to generate an out-of-plane deformation of the holding surface 430. In accordance with the present invention, the actuator assembly 450 is configured to deform the main body 410 based on shape information of the object that is to be held. In accordance with the present invention, an out-of-plane deformation of a surface refers to a deformation of the surface in an direction that is not parallel to the surface, e.g. perpendicular to the surface. For the given example in FIG. 4, an out-of-plane deformation of the holding surface 430 may thus be a deformation in the indicated Z-direction.

The object table 400 according to the present invention may advantageously be applied for holding objects that are curved or warped. In particular, as will be explained in more detail below, the object table 400 according to the present invention can take an unflatness of the object to be held into account. By doing so, adverse effects occurring when a curved or warped object is clamped onto a substantially flat surface can be avoided.

In FIG. 5 (a1, a2, b1, b2), a clamping or holding process of an object as performed by a known object table is schematically illustrated.

In a first step, illustrated in FIG. 5 (a1), an object, e.g. a substrate, 540 is brought in the vicinity of an object table 500, the object table comprising a plurality of burls 520 extending from a main body 510, the end surfaces of the burls defining a holding surface 530 of the object table 500. The object 540 can e.g. be brought in the vicinity by a robot arm (not shown), which places the object 540 onto a plurality of pin-shaped members 550 that protrude the object table 500, as shown in FIG. 5 (a1). Such pin-shaped members 550 may e.g. be part of a loading/unloading assembly or mechanism of the object table 500. When the pin-shaped members 550 are lowered, the object 540 may be arranged to contact the holding surface 530 or burl surface, as shown in FIG. 5 (a2). As can be seen, the object 540 that is to be clamped has a curved shape, i.e. it has a non-flat surface 540.1 to contact the object table 500.

In a second step, illustrated in FIG. 5 (b1, b2), the object 540 may be held or clamped onto the holding surface 530 by exerted a clamping or holding force onto the object 540. FIG. 5 (b1) schematically illustrates the exerted forces 560 to clamp the object 540, the bottom portion illustrates the object 540 in a clamped state on the object table 500, in particular on the holding surface 530 on the object table 500. The forces 560 to clamp or hold the object 540 may e.g. be generated by a vacuum clamp or electrostatic clamp that is incorporated in the object table 500. They may also partially be generated by the pin-shaped members 550.

It has been observed that the clamping of an object 540, in particular a curved or warped object, onto a substantially flat holding surface 530 may require that the object 540 has to slide over the burls 520. In particular, starting from having a few initial points or regions of contact with the object table 500, the object 540 will be forced, by the clamping forces 560, into its clamped shape via a sliding over the burls 520 of the object table 500. Such a sliding relative motion may negatively affect the quality of the process as performed when the object 540 is held, e.g. a lithographic exposure or patterning process. In particular, in case the object is a semiconductor substrate, such a sliding may cause deformations of the substrate in a direction parallel to the substrate surface. Such deformation may e.g. adversely affect an alignment between the pattern that is projected onto the substrate and a previously patterned layer. Phrased differently, the deformations may cause an alignment error between consecutive patterned layers of the semiconductor substrate. Such an alignment error may cause a malfunction of the semiconductor device that is manufactured, thus adversely affecting the yield of the manufacturing process.

In particular, the sliding may cause wear of the burls. Such wear can e.g. cause an unflatness of the holding surface 530, i.e. the holding surface as defined by the end-surfaces of the burls. Further, surface roughness of the burls may be negatively affected. This may in turn affect the sliding friction and hence the in-plane deformation in subsequent loading steps. In addition, the sliding of the object across the burls may generate particles that can contaminate e.g. the burl surface.

Using the object table according to the present invention enables the holding or clamping of an object in such manner that a sliding relative motion of the object over the burls can be avoided or mitigated.

It can be pointed out that sliding relative motion of the object over the burls will typically occur during loading when a loading as illustrated in FIG. 5 is performed. In case the object has an umbrella shape rather than the illustrated bowl shape, the relative movements would typically even be larger.

Figure 6:
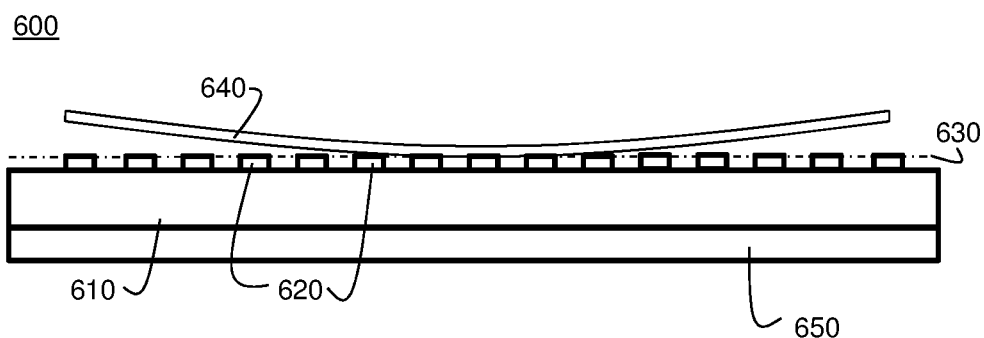
FIGS. 6a to 6d illustrate a loading sequence as can be applied using the present invention.
Figure 6:
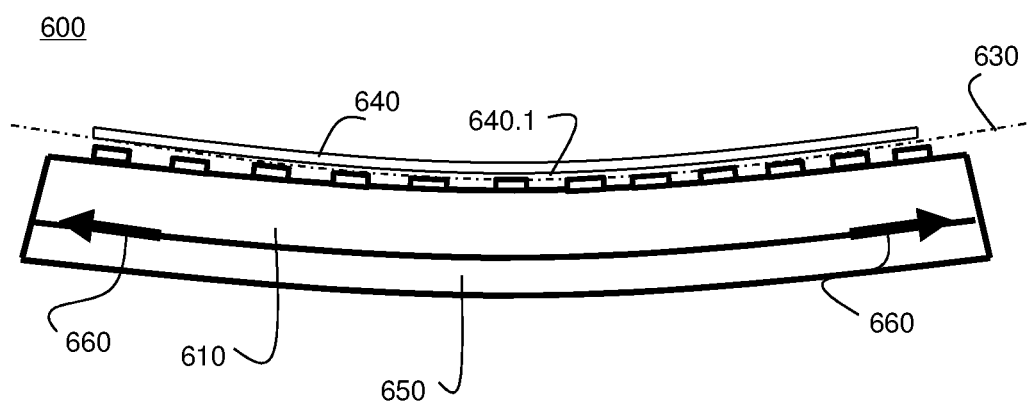
Figure 6:
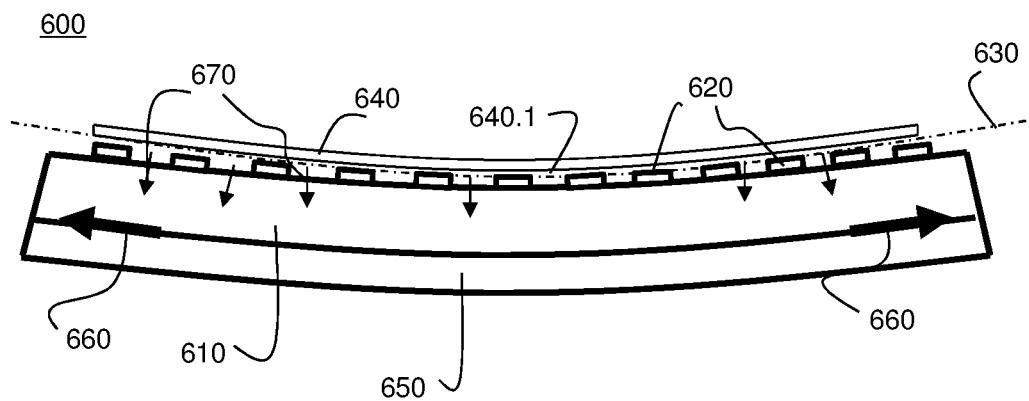
Figure 6:
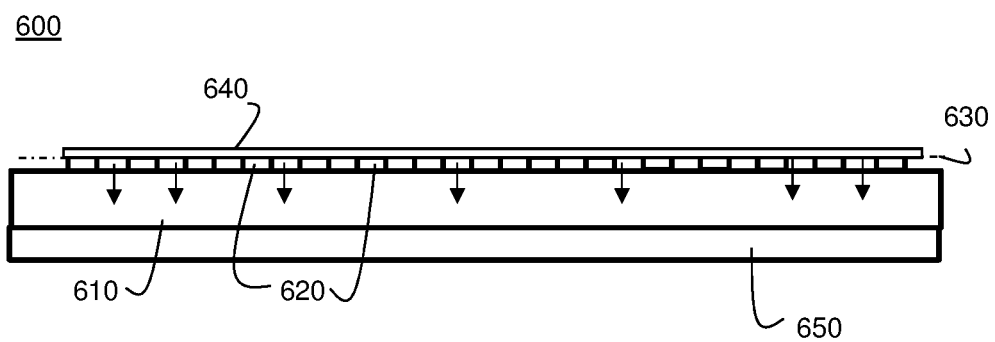

FIG. 6 schematically illustrates a method of holding or clamping an object according to the present invention, using an object table 600 according to the present invention. For clarity, the loading mechanism, e.g. comprising one or more pin-shaped members, is not shown.

In FIG. 6(a), an object table 600 according to the present invention is schematically shown, the object table comprising, similar to the object table 400 of FIG. 4, a main body 610 and a plurality of burls 620 extending from the main body 610, the end surfaces of the burls 620 defining a holding surface 630 onto which an object 640 such as a substrate can be mounted or clamped. In the embodiment as shown, the object 640 may e.g. be a curved object comparable to the curved object 540 shown in FIG. 5. The object 640 may e.g. be arranged in a vicinity of the object table 600 in a similar manner as discussed with reference to FIG. 5. Use can e.g. be made of a loading/unloading mechanism or an assembly that is configured to load the object onto the holding surface and to unload the object from the holding surface 630. Such a loading/unloading mechanism may e.g. comprise one or more pin-shaped members configured to protrude through the object table in a direction substantially perpendicular to the holding surface 630.

The loading of the object 640 onto the holding surface 630 may thus result in an arrangement as shown in FIG. 6(a), whereby the object 640 is supported by the object table 600 at a few points of contact. In accordance with the present invention, the object table 600 further comprises an actuator assembly 650 that is configured to deform the main body 610 of the object table 600 so as to generate an out-of-plane deformation of the holding surface 630. Within the meaning of the present invention, an out-of-plane deformation comprises a deformation in a direction substantially perpendicular to a plane that is substantially parallel to the holding surface 630.

By deforming the main body 610 of the object table 600, the holding surface 630 onto which the object 640 is to be clamped can be shaped in accordance with the shape of the object 640 that is to be clamped. In particular, the actuator assembly 650 as applied in the object table 600 according to the present invention may be configured to deform the main body of the object table in such manner that the holding surface of the object table has a similar shape, e.g. a substantially similar curvature or warpage, as the object 640 that is to be clamped. This is schematically shown in FIG. 6(b). Starting from the situation as depicted in FIG. 6(a), i.e. a position whereby a curved object 640 is supported onto an object table, the actuator assembly 650 of the object table 600 may exert forces 660 onto to the main body 610 of the object table to deform the main body and generate an out-of-plane deformation of the holding surface 630. In particular, as can be seen in FIG. 6(b), the main body 610 of the object table 600 is deformed in such manner that the holding surface 630 has a curvature that substantially corresponds to the curvature of the contact surface 640.1 of the object that is to be held. Within the meaning of the present invention, an arrangement whereby the object table, in particular the holding surface of the object table, is shaped in accordance with the object that is to be clamped or held is referred to as a conformal loading of the object or a conformal object loading. As such, within the meaning of the present invention, a conformal loading of an object refers to the loading of an object in such manner that the surface onto which the object is loaded has a similar shape as the object, e.g. as a bottom surface of the object.

In the embodiment as shown in FIG. 6, the object 640 is lowered onto the object table 600 before the main body 610 of the object table 600 is deformed by the actuator assembly 650. As will be understood by the skilled person, the order in which the step of lowering the object 640 onto the object table 600 and the step of deforming the main body 610 are performed may also be reversed. i.e. the main body 610 may be deformed so as to generate an out-of-plane deformation of the holding surface 630 prior to the lowering of the object 640 onto the object table 600. The steps may even be performed at least partially in parallel, i.e. at substantially the same time. In a preferred embodiment of the present invention, the object table 600 is deformed by the actuator assembly 650 prior to the object 640 contacting the object table. Such embodiment enables to substantially avoid a sliding relative motion between the object and the holding surface, e.g. the end-surface of burls of the object table.

Once the conformal loading of the object is established, the object 640 may then be clamped onto the object table. This is schematically illustrated in FIG. 6(c). In order to hold or clamp the object 640, the object table 600 can be configured to exert a holding force, indicated by the arrows 670 in FIG. 6(c), on the object 640, said holding force 670 being directed to pull the object 640 towards the surface 630, i.e. onto the end surfaces of the burls 620. Such a holding or clamping force 670 may e.g. be exerted or generated by a vacuum clamp or an electrostatic clamp that is integrated in the object table. It may also be provided partially by the loading mechanism or loading assembly, e.g. by pin-shaped members of such assembly. Note that the application of the clamping force is performed while the conformal object loading is established. As a result, the object can be clamped to the object table 600, substantially without sliding.

Once the object 640 is clamped to the object table 600, the forces 660 that caused the out-of-plane deformation of the main body 610 can be removed, resulting in the object table 600 resuming its substantially flat shape. Note that, in order for the object table 600 to resume its substantially flat shape, a brief application of a force reversal, i.e. a force in opposite direction as the forces 660, may be applied. By doing so, a stiffness of the object table 600 can be accounted for. In FIG. 6(d), the object table 600 has resumed its initial shape and the object 640 is held, by means of the holding forces 670, onto the holding surface 630. Within the meaning of the present invention, the initial shape of the object table refers to the shape of the object table when no forces are exerted on the object table that cause the out-of-plane deformation.

In accordance with the present invention, a conformal loading of an object may thus be realised, such conformal loading enabling to clamp or hold an object onto an object table, substantially without the aforementioned problems, such as sliding.

In case the object that is to be clamped is a substrate such as a semiconductor substrate, typical deformations that may occur during the processing of such a substrate may cause a bending of the substrate. Such bending may result in the substrate having an umbrella-shape or inverted umbrella-shape, or a saddle shape. In general, the object or parts thereof may bend in various shapes. The shape of an object may e.g. be described mathematically as a superposition or combination of one or more basic deformations or basis shapes. In case of a circular object such as a semiconductor substrate, the shape of such an object can e.g. be described by means of a combination of Zernike polynomials or the like. In order to enable a conformal loading of the substrate, the holding surface onto which the substrate, in general the object, is held, is to be deformed in a similar manner as the substrate. In an embodiment of the present invention, the out-of-plane deformation of the main body of the object table thus includes a bending of the holding surface.

Figure 7:
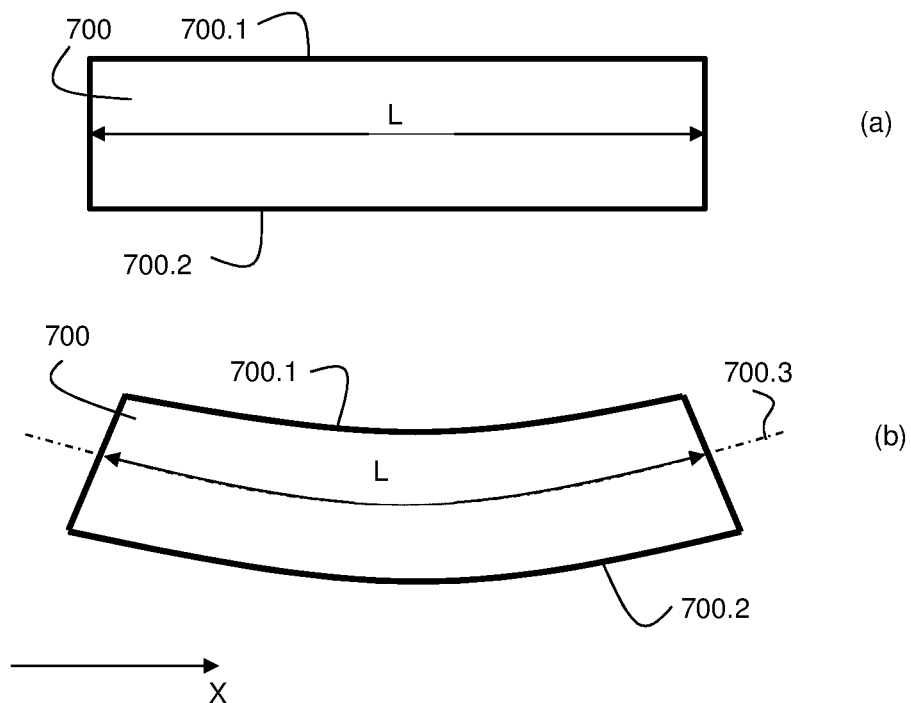
FIG. 7 depicts a bending of an object and a neutral plane of the object as known in the art.

When an object, in particular a substantially homogeneous object, is subjected to a bending force, certain portions of the object will typically be compressed, while other portions are elongated. Further, when such a substantially homogeneous object is caused to bend, a neutral bending line or neutral bending surface or neutral plane can be defined inside the object, which neutral plane is not compressed or elongated. This is schematically illustrated in FIG. 7. FIG. 7(a) schematically illustrates an object 700 in an un-deformed state, the object having a first surface 700.1 and an opposite second surface 700.2 and a length L in the X-direction. FIG. 7(b) shows the object 700 when subjected to a bending force or torque. As a result of the bending force, the first surface 700.1 of the object 700 is compressed, whereas the second surface 700.2 becomes elongated or extended. Inside the object 700, a surface 700.3 may defined, referred to as the neutral plane, which is not compressed or elongated. The length of the object along said plane thus being equal to the length L.

In case an object is not substantially homogeneous, but e.g. designed from different components having different mechanical properties, and is subjected to a particular bending load, the relative position of the neutral plane may be selected or designed to fit a particular purpose.

In an embodiment of the present invention, the object table according to the present invention is designed in such manner that the neutral plane caused by bending of the main body of the object table is arranged to substantially coincide with a neutral plane of the object, e.g. a substrate, that is to be held on the object table.

Figure 8:
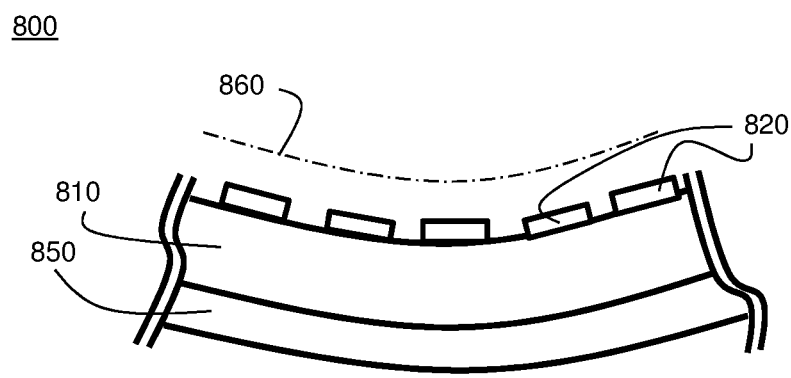
FIG. 8 depicts a bending of an object table according to the present invention and an associated neutral plane.

This is schematically illustrated in FIG. 8.

FIG. 8 schematically shows a cross-sectional view of a part of an object table 800 according to an embodiment of the present invention, the cross-sectional view showing the object table 800 in a bended or curved state. Such a bended or curved state can e.g. be realized by an appropriate actuation of the actuator assembly 850 of the object table 800, the actuator assembly 850 being configured to deform the main body 810 of the object table 800, so as to generate an out-of-plane deformation of the holding surface of the object table. In the embodiment as shown, the holding surface is defined by the end-surfaces of the burls 820 of the object table 800. In the embodiment as shown, the dash-dotted line 860 represents the neutral plane of the object table, when the object table is subject to a bending force, e.g. generated by the actuator assembly 850. In an embodiment of the present invention, the object table 800 is designed in such manner that the location of the neutral plane substantially corresponds to the neutral plane of the object that is to be held by the object table, e.g. a semiconductor substrate, once loaded to the object table. In order to realise that the object table has a neutral plane 860 at the location as shown, i.e. outside the object table, the object table may e.g. be manufactured from different materials, having different mechanical properties. The object table 800, in particular the main body of the object table may e.g. be constructed from multiple layers having a different mechanical stiffness.

In an embodiment the actuator assembly 850 may comprise multiple layers of piezoelectric material, wherein each layer of piezoelectric material can be actuated and preferably can be actuated separately per layer. Via calibration steps, which may be performed in advance or in-situ, it is possible to determine the relationship between the actuation setpoint per layer and the amount of bending and strain of the neutral line of the object table 800. In an embodiment the multiple layers of piezoelectric material may be poled or oriented differently e.g. in such a way that the poling or crystal orientation differences between the different layers together span 360 degrees in total (e.g. an actuator assembly comprising three layers of piezoelectric material wherein each layer is poled or oriented 120 degrees different with respect to the other two layers). This is advantageous as it allows the actuator to apply a bending force in a specific direction if the different layers of piezoelectric material can be actuated separately. In an alternative embodiment six layers of piezoelectric material may be formed wherein each layer of piezoelectric material has a poling or orientation direction with a 60 degrees poling or orientation difference with respect to the other five layers of piezoelectric material. This is advantageous as each layer has a different distance with respect to the neutral plane of the object table 800, making it possible to compensate for e.g. small manufacturing tolerances in the object table 800. Note that the above indicated number of layers and poling or orientation direction differences is however not limiting and any other number of layers of piezoelectric material and another difference in poling direction or orientation may also be possible. Alternatively a number of layers of piezoelectric material having a specific poling direction or orientation may be repeated in the stack of the actuator assembly (i.e. multiple stacks of piezoelectric material having the same poling direction or orientation distribution on top of each other).

In order to generate the out-of-plane deformation of the holding surface, the object table according to the invention is provided with an actuator assembly. Such an actuator assembly may comprise one or more actuators. Various types of actuators may be applied to provide the required functionality of deforming the main body of the object table so as to generate the required out-of-plane deformation. With respect to the generation of an out-of-plane deformation of a holding surface of an object table, it can be mentioned that it has been suggested to apply, as burls or parts thereof, piezo-electrical actuators to change a height of the burls. It can be acknowledged that a change in the length of the burls of an object table can be considered an out-of-plane deformation as well. However, considering that the available or obtainable compression or elongation of a piezo-electric element is rather limited, e.g. 0.1%, only a very small out-of-plane deformation of the holding surface can be established. The solution as provided by the present invention, whereby the main body of the object table is deformed, enables to generate out-of-plane deformations with a much larger amplitude than deformations that can be realised by applying actuators in the burls.

In case of the application of the present invention in the field of lithography, whereby the object can e.g. be a semiconductor substrate, the curvature or warpage of substrates that need to be held on object tables may e.g. have an amplitude of several hundreds of μm, e.g. in the range of 200-1000 μm.

Figure 9:
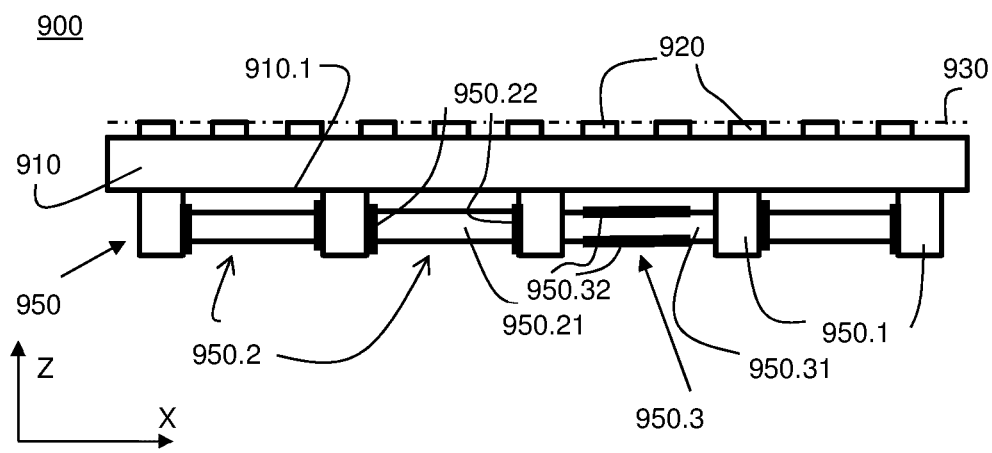
FIGS. 9 to 13 illustrate various embodiments of object tables according to the present invention.

FIG. 9 schematically shows a more detailed embodiment of an object table 900 according to the present invention, the object table 900 including an actuator assembly 950 for deforming the main body 910 of the object table 900. In the embodiment as shown, the actuator assembly 950 comprises a plurality of protrusions 950.1 extending from the bottom surface 910.1 of the main body 910 and a plurality of piezo-electric actuators 950.2. The protrusions 950.1 may e.g. be integral parts of the main body of the object table or may be separately mounted to the bottom surface of the main body. Such protrusions can e.g. be made by subtractive manufacturing processes such as machining or etching, either directly as an integral part of the main body, or can be machined separately and mounted, e.g. by means of an adhesive, to the main body of the object table. In the embodiment as shown, the piezo-electric actuators are arranged in between a pair of protrusions 950.1, i.e. they form connections between a pair of protrusions 950.1. The piezo-electric actuators 950.2 include one or more piezo-electric elements 950.21 and one or more electrodes 950.22, the electrodes 950.22 being configured to, when connect to a power supply, generate an electric field in the piezo-electric elements 950.21, the electric field causing the piezo-electric elements to deform. In the embodiment as shown, the electrodes 950.22 are arranged on the end-surfaces of the piezo-electric elements 950.21. The piezo-electric elements 950.21 may e.g. be rod shaped or beam shaped, i.e. having a circular or rectangular cross-section. When an electric field is generated between the pair of electrodes on the end-surfaces, the piezo-electric elements 950.21 will elongate or compress, depending on the orientation of the electric field. Such an elongation or compression will force, as will be appreciated by the skilled person, the protrusions 950.1 that are connected to the piezo-electric actuator 950.2 to displace relative to each other. Such a displacement will cause a deformation of the main body 910 of the object table. In particular, a relative displacement of the protrusions 950.1 will cause a bending of the main body 910 of the object table, said bending causing an out-of-plane deformation of the holding surface 930 of the object table 900, the holding surface 930 being defined by the end surfaces of the burls 920 of the object table. In an embodiment the piezo-electric actuator 950.2 may be split-up in at least two individually controllable actuators which are positioned at a different (out-of-plane) distance, such that these can separately control in-plane strain and curvature through (approximately) common-mode and differential actuation respectively. This is advantageous for the same reasons as explained above and it reduces manufacturing tolerances. As an alternative to having the electrodes 950.22 arranged on the end-surfaces of the piezo-electric elements 950.21, it can be pointed out that the electrodes may also be arranged on side-surfaces of the piezo-electric elements 950.21. In FIG. 9, piezo-electric actuator 950.3 has electrodes 950.32 arranged on side-surfaces of the piezo-electric element 950.31 of the piezo-electric actuator 950.3. by energizing said electrodes 950.32, the piezo-electric element 950.31 will deform as well. In particular, when applying a voltage to the electrodes 950.32, the electric field inside the piezo-electric element will e.g. cause the element to elongate or compress in the Z-direction. As a result, the element will experience a compression resp. elongation in the X-direction. Note that the amplitude of the compression or elongation in the X-direction will typically be only about half the compression or elongation in the Z-direction. An actuation whereby the piezo-electric actuator is actuated in a first direction (e.g. the Z-direction) to cause a deformation in a second direction may e.g. be referred to as a $d_{31}$ operation or actuation whereas and actuation of the piezo-electric actuator in a direction (e.g. the X-direction) to cause a deformation in the same direction may e.g. be referred to as a $d_{33}$ operation or actuation. Note that a combination of both types of actuation may be applied as well in an actuator assembly as applied in an object table according to the present invention.

In the embodiment as shown in FIG. 9, the actuator assembly 950 thus comprises a plurality of discrete piezo-electric actuators 950.2, 950.3 which can be individually actuated to cause a deformation of the main body 910 of the object table 900.

Figure 10:
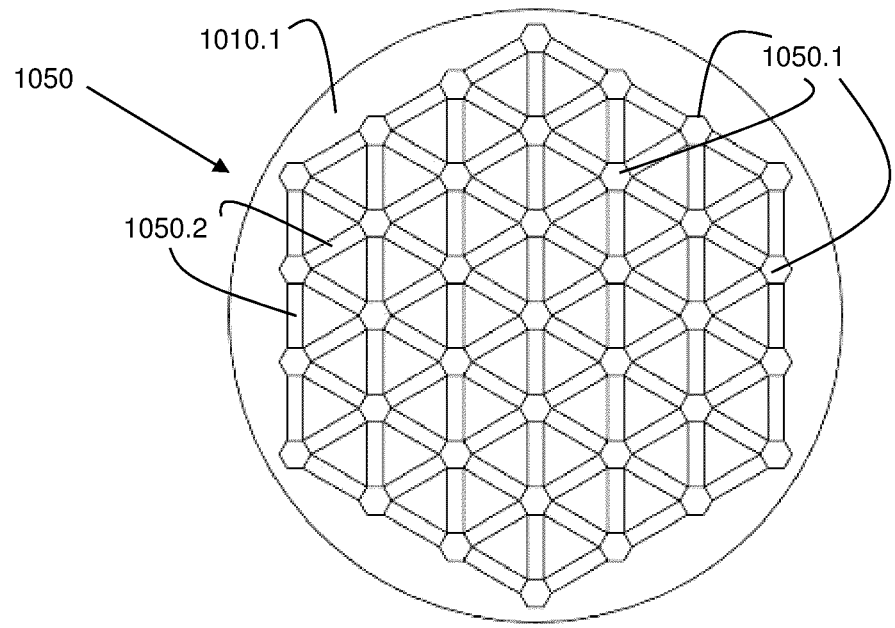

In an embodiment of the present invention, the piezo-electric actuators and the electrodes are arranged in a grid. FIG. 10 schematically shows a bottom view of such an actuator assembly 1050. In the embodiment as shown, a plurality of protrusions 1050.1 is shown, said protrusions e.g. mounted to a bottom surface 1010.1 of a main body of an object table according to the invention. In the embodiment as shown, piezo-electric actuators 1050.2 are arranged that connect adjacent pairs of protrusions 1050.1. As will be appreciated, other types of distributions of the protrusions or actuators can be considered as well. As an alternative to the triangular grid of actuators shown in FIG. 10, a rectangular or spider-web like grid can be considered as well. As will appreciated by the skilled person, the denser the grid of actuators that is applied, i.e. the more actuators available, the more degrees of freedom one has available to deform, i.e. shape the main body of the object table and thus the holding surface of the object table. Formulated in a more mathematical manner: when more degrees of freedom are available, more deformation modes of the object can be addressed, resulting in a more accurate conformal loading of the object.

Figure 11:
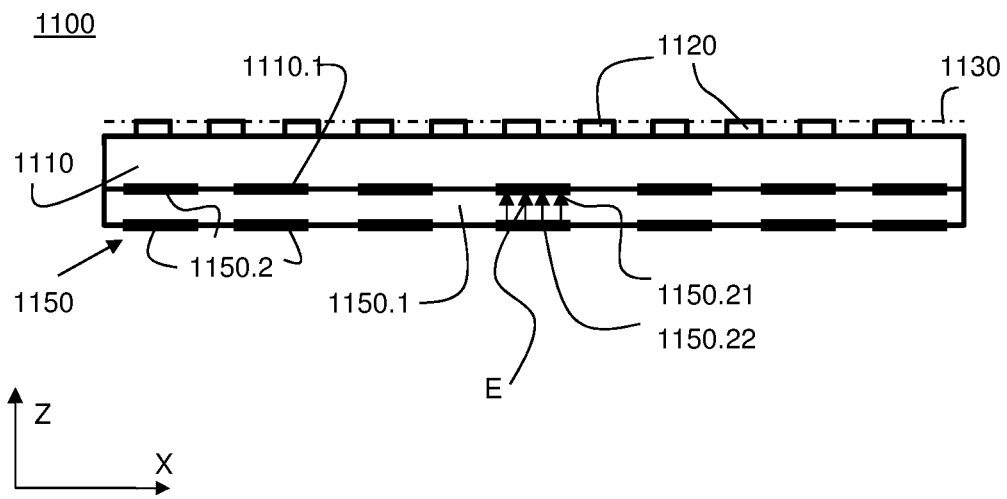

In FIG. 11, another embodiment of an actuator assembly as can be applied in an object table according to the present invention is schematically shown.

FIG. 11 schematically shows a cross-sectional view of an object table 1100 according to an embodiment of the present invention, the object table 1100 comprising a main body and an actuator assembly 1150. The actuator assembly 1150 comprises a layer 1150.1 of a piezo-electric material and a plurality of electrodes 1150.2 arranged on the layer 1150.1. in the embodiment as shown, both outer planar surfaces of the layer 1150.1 are provided with a plurality of discrete electrodes. Alternatively, one of the planar surfaces of the layer 1150.1 may be provided with a single electrode substantially spanning or covering the entire surface. Such an electrode may then e.g. be connected to a ground potential. The actuator 1150 as schematically shown can be used to generate a deformation of the main body 1110 of the object table 1100, by applying a $d_{31}$ operation or actuation of the layer of piezo-electric material. This can be understood as follows: When applying a voltage difference to electrodes 1150.21 and 1150.22, an electric field E will be generated in the portion of the layer 1150.1 that is arranged between said electrodes 1150.21 and 1150.22. Said electric field E will cause said portion to elongate or compress in the Z-direction and, at the same time, will cause said portion to compress resp. elongate in the X-direction. This deformation of said portion of the layer 1150.1 will cause a deformation of the main body 1110 of the object table 1100 to which the layer 1150.1 is attached, said deformation causing an out-of-plane deformation of the holding surface 1130 of the object table 1110, the holding surface 1130 being defined by the end-surfaces of the burls 1120 of the object table 1100.

By an appropriate sizing and arranging of the electrodes 1150.2, the actuator assembly 1150 can be configured to, in a similar manner as the actuator assembly 950 shown in FIG. 9, generate a desired out-of-plane deformation of the holding surface 1130, the out-of-plane deformation enabling a substantially conformal loading of the object, e.g. the semiconductor substrate.

As a suitable material to form the layer 1150.1 of the actuator assembly 1150 or the piezo-electric elements 950.21 shown in FIG. 9, any piezo-electric material such as lead zirconate titanate (PZT) or lithium niobite (LiNBO3), or materials performing a similar function such as electro- or magnetostrictive materials can be mentioned.

In an embodiment of the present invention, the object table further comprises a control unit for controlling the actuator assembly. Such a control unit can e.g. be embodied as a microprocessor, microcontroller, FPGA, computer or the like. Such a control unit may e.g. comprise a memory unit to store data and a processing unit for processing data and generating output signals such as control signals. Typically, such a control unit is configured to receive input signals or data, e.g. via an input terminal and to output control signals, e.g. via an output terminal.

In accordance with the present invention, a control unit may be applied, whereby said control unit is configured to receive or determine shape information about the object that is to be held and is configured to generate one or more control signals to control the actuator assembly of the object table, based on the shape information.

In such embodiment, the control unit may e.g. be configured to determine one or more control signals for controlling a power supply that powers the actuator assembly. Said control signals may control the power supply in such manner that the actuator assembly provides the required out-of-plane deformation of the holding surface.

Figure 12:
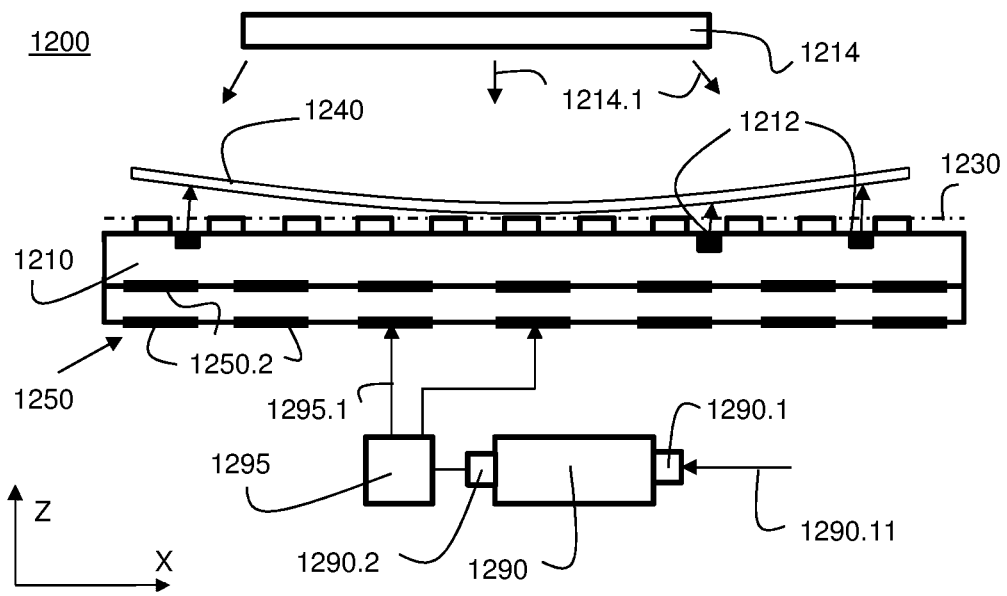

FIG. 12 schematically shows an embodiment of an object table 1200 according to the present invention that includes a control unit 1290 for controlling the actuator assembly 1250 of the object table 1200. FIG. 12 also schematically shows the outline of a warped or curved object 1240 that is to be held on the holding surface 1230 of the object table 1200. The object table 1200 includes an actuator assembly that substantially corresponds to the actuator assembly 1150 of FIG. 11. In the embodiment as shown, the control unit 1290 comprises an input terminal 1290.1 configured to receive an input signal 1290.11, said input signal e.g. representing or comprising shape information about the object 1240 that is to be held. In the embodiment as shown, the control unit 1290 further comprises an output terminal 1290.2 for outputting control signals to a power supply 1295 that is configured to power the electrodes 1250.2 of the actuators of the actuator assembly 1250, as indicated by the arrows 1295.1.

In an embodiment of the present invention, the shape information provides information about the curvature or warpage of the object that is to be held. Such information may be obtained at various locations and at various instants. Such shape information may e.g. be obtained during a pre-processing of the object, i.e. prior to the object being loaded onto the object table. In case of a semiconductor substrate, such preprocessing may e.g. involve performing a temperature conditioning and/or a pre-alignment of the substrate. Such processes may e.g. be performed in a handler module of a lithographic apparatus. In an embodiment, such a handler module may e.g. be equipped to determine a shape of the substrate, in particular an out-of-plane shape of the substrate. In order to do so, the handler module may e.g. be equipped with a height sensor or measurement device.

In an embodiment of the present invention, the shape information of the object that is to be held may also be obtained when the object 1240 is loaded onto the object table 1200. In such embodiment, the object table may e.g. comprise a sensor assembly configured to sense a shape of the object that is to be held. Such a sensor assembly can e.g. comprise one or more proximity sensors 1212 configured to determine a proximity of the object when loaded onto the holding surface 1230. In the embodiment as shown in FIG. 12, the object table 1200 thus comprises a plurality of proximity sensors 1212 which can generate a signal representing a distance between the bottom surface of the object 1240 and the object table 1200. Such signals may e.g. serve as shape information for controlling the actuator assembly 1250 of the object table 1200. Alternatively, the object table 1200 may be configured to receive the shape information from a height measurement system 1214 that is arranged in the vicinity of the object table, e.g. above the object table. Such a height measurement device 1214 may e.g. be configured to scan the surface of the object 1240, indicate by the arrows 1214.1, prior to the object being held or clamped to the holding surface 1230, thereby obtaining height information about the object representing a shape of the object 1240. Alternatively the height measurement system 1214 is located at another suitable location, e.g. in the wafer handler.

In an embodiment of the present invention, the object table comprises a further actuator assembly that is configured to generate a further deformation of the holding surface. Such a further deformation of the holding surface can e.g. be a further out-of-plane deformation of the holding surface and/or an in-plane deformation of the holding surface.

In an embodiment, the further actuator assembly comprises one or more actuators that are configured to actuate the burls of the object table. Such actuators can e.g. comprise piezo-electric actuators that are integrated in the burls or substantially form the burls. By actuating the piezo-electric actuators of such embodiment, the end-surfaces of the burls, said end-surfaces defining the holding surface for holding the object, can be displaced. Such a displacement can either be in a direction substantially parallel to the holding surface, resulting in an in-plane deformation of the holding surface or can be in a direction substantially perpendicular to the holding surface, resulting in an out-of-plane deformation of the holding surface.

In an embodiment of the present invention, the further actuator assembly is integrated in the main body of the object table. Such an embodiment is schematically shown in FIG. 13.

Figure 13:
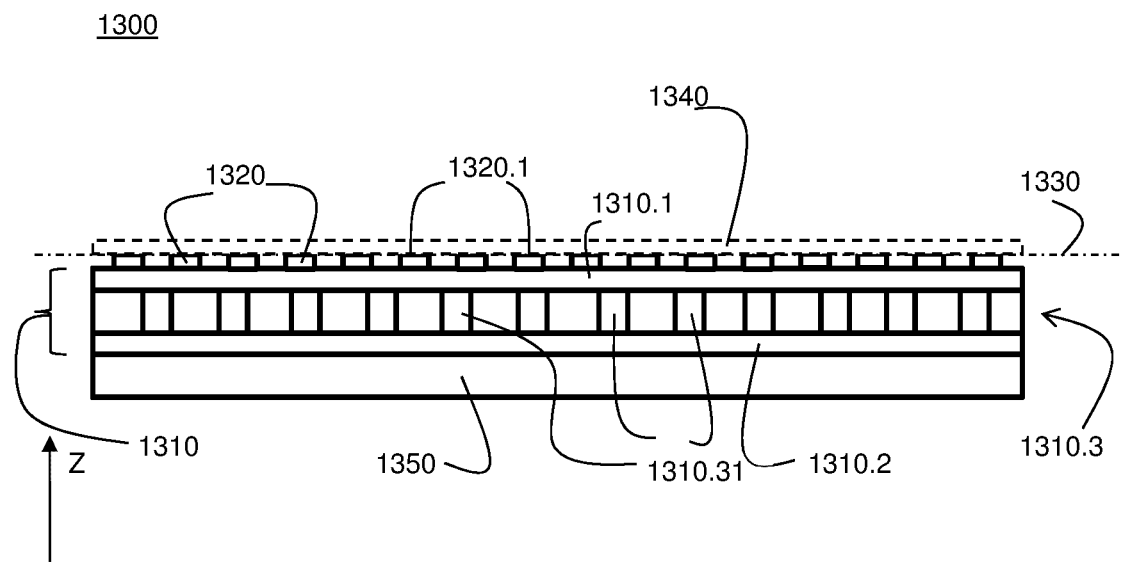

FIG. 13 schematically shows an object table 1300 according to an embodiment of the present invention. In the embodiment as shown, the object table 1300 comprises a main body 1310. In the embodiment as shown, the main body 1310 comprises a first member 1310.1, e.g. a substantially planar member, and a second member 1310.2, e.g. a substantially planar member, spaced apart from the first member 1310.1. The main body further comprises a further actuator assembly 1310.3 arranged in between the first member 1310.1 and the second member 1310.2 of the main body. The further actuator assembly 1310.3 can e.g. comprise a plurality of discrete actuators 1310.31. Such actuators 1310.31 can e.g. be piezo-electric actuators. In the embodiment as shown, the object table 1300 further comprises a plurality of burls 1320 extending from the main body 1310, in particular from the first member 1310.1 of the main body 1310. In the embodiment as shown, the end surfaces 1320.1 of the burls 1320 define a holding surface 1330 onto which an object 1340 such as a substrate can be mounted or clamped. In the embodiment as shown, the object table 1300 further comprises an actuator assembly 1350 configured to deform the main body 1310 of the object table to generate an out-of-plane deformation of the holding surface 1330. The actuator assembly 1350 may e.g. be configured in a similar manner as the actuator assemblies as described above, e.g. actuator assemblies 1250, 1150, 1050, 950, 850, 650 or 450. In the embodiment as shown, the actuators 1310.31 can e.g. be configured to deform in the Z-direction and/or to deform in the XY-plane, the XY-plane being perpendicular to the indicated Z-direction. By doing so, the further actuator assembly will cause similar deformations in the holding surface 1330 of the object table 1300. I.e. the further actuator assembly may cause in-plane or out-of-plane deformations of the holding surface 1330 of the object table 1300. In an embodiment of the present invention, the further actuator assembly may advantageously be applied to correct or avoid, at least partly, local disruptions of the object, e.g. the semiconductor substrate. Such disruptions can be of a static nature or may have a time-depend nature. Examples of such local disruptions can e.g. be a particle contaminating the holding surface of the object table. Such contamination may e.g. cause an out-of-plane deformation of the holding surface and thus of the object itself when held or clamped on the object table. Another example is a local heating of the object, e.g. due to the application of a scanning exposure process to the object. Such a local heating may e.g. cause a local deformation, an in-plane and/or out-of-plane deformation, of the object.

In case the object is a semiconductor substrate that is to be exposed by a patterned beam of radiation, the further actuator assembly can be applied to allow for deformations of the substrate at higher spatial resolution to obtain better conformity between the aerial image of the patterned beam and the image plane on the object during exposure of a target portion of the substrate, e.g. to compensate for thermal deformations in the patterning device or projection system, to compensate for residual unflatness of the object table or to compensate for particle contamination at the object table.

In an embodiment the actuator or actuators as applied in the further actuator assembly may be controlled by the control unit controlling the actuator assembly. In such embodiment, the control unit may receive and use data related to e.g. detected contamination or information associated with possible particle contamination for controlling the further actuator assembly. As an example, level sensor data characterizing a height map of the object that is to be held may be used to assess the presence of particle contamination on the holding surface holding the object. Information regarding the applied process on the object, e.g. a patterning exposure process may be used to determine a local thermal load of the object, which information may also be used to control the further actuator assembly. The inputs for the control unit may also be obtained from one or more proximity sensors, e.g. high resolution proximity sensors, that are integrated in the object table.

In an embodiment, the actuator assembly as applied in the object table according to the present invention may be configured to generate an out-of-plane deformation of the holding surface with a comparatively large amplitude, e.g. several hundreds of μm, whereas the further actuator assembly as applied in the object table according to the present invention may be configured to generate an out-of-plane deformation of the holding surface with a comparatively small amplitude, e.g. <1 μm. In such embodiment, the out-of-plane deformation as generated by the actuator assembly may also be denoted as a coarse or long-stroke deformation whereas the out-of-plane deformation as generated by the further actuator assembly may also be denoted as a fine, or short-stroke, or more accurate, deformation. By the combined action of the actuator assembly and the further actuator assembly, an accurate desired out-of-plane deformation with a comparatively large amplitude may be realised.

In the embodiment as schematically shown in FIG. 13, a combination of an actuator assembly and a further actuator assembly are applied. As explained above, the actuator assembly as applied into the present invention enables a loading or clamping or holding of an object in such manner that the generation of mechanical stresses in the object, due to said clamping or holding, can substantially be avoided. In the embodiment as shown, the further actuator assembly as described may be applied to generate local, comparatively small local deformations of the holding surface. When the actuator assembly and the further actuator assembly are combined, an important synergetic effect can be reached. This can be understood as follows: in the absence of the actuator assembly as applied in the object table according to the invention, substantial stresses and corresponding deformations could occur throughout the object, which deformations could only be addressed using the further actuator assembly. As the available stroke or range of the further actuator assembly is rather limited, the sole use of the further actuator assembly may be insufficient to both address the stresses and deformations caused by the loading or clamping and the local deformations and stresses, e.g. caused by contamination and/or thermal loading. As such, the combined use of the actuator assembly and the further actuator assembly may substantially improve the effectiveness of the further actuator assembly in addressing local deformations.

According to an aspect of the present invention, the object table according to the present invention is applied in a stage apparatus according to the present invention. In an embodiment, the stage apparatus according to the present invention comprises a positioning device, also referred to as positioner, for positioning the object table. Such a positioning device or positioner may e.g. comprise one or more linear motors or planar motors for displacing the object table over comparatively large distances, e.g. up to ~0.5 m or more, and/or one or more actuators for displacing the object table over comparatively small distances, e.g. up to ~1 mm.

In an embodiment, the positioning device of the stage apparatus according to the present invention may comprise a long-stroke module and a short-stroke module. In such embodiment, the short-stroke module is arranged to move the object table relative to the long-stroke module with a high accuracy over a small range of movement. The long-stroke module is arranged to move the short-stroke module and the object table at a relatively low accuracy over a large range of movement. With the combination of the long-stroke module and the short-stroke module, the stage apparatus is able to move the object table with a high accuracy over a large range of movement. When applied in a lithographic apparatus, the stage apparatus may e.g. be configured to move a substrate, mounted to the object table, with a high accuracy over a large range of movement, relative to a projection system of the lithographic apparatus.

Figure 14:
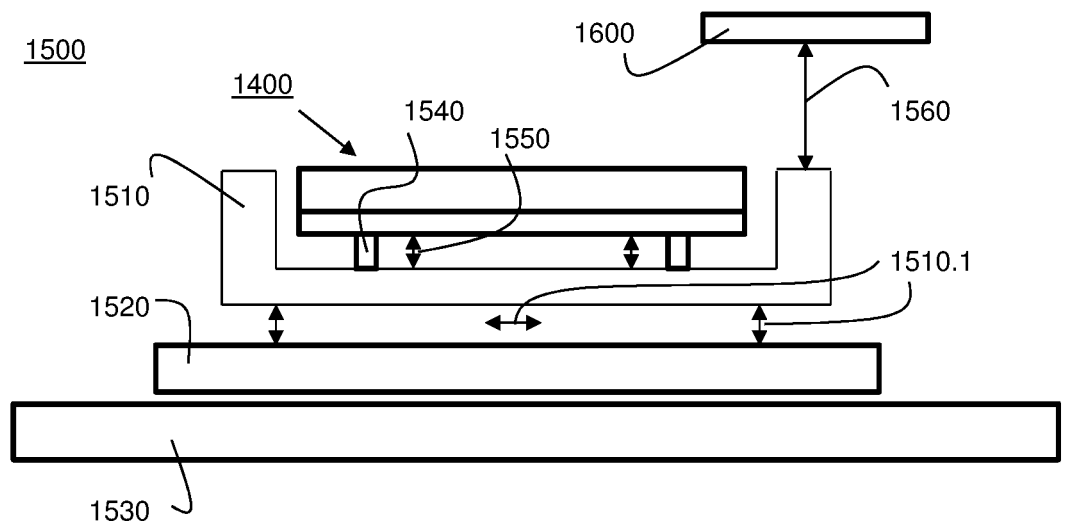
FIG. 14 schematically depicts a cross-sectional view of a stage apparatus according to the present invention.

FIG. 14 schematically shows a cross-sectional view of a stage apparatus 1500 according to the present invention. The stage apparatus 1500 comprises an object table 1400 according to an embodiment of the present invention and a positioning device or positioner 1510, 1520, 1530. The object table 1400 may be any object table according to the invention as described above. In the embodiment as shown, the object table 1400 is mounted to a short-stroke module or short stroke mover 1510. The short-stroke module or mover 1510 can be displaced over comparatively small distances relative to the long-stroke module or long-stroke mover 1520. Arrows 1510.1 indicate actuating forces that can be exerted on the short-stroke mover 1510, e.g. by actuators such as Lorentz actuators, to displace or position the short-stroke module relative to the long-stroke module or mover 1520. The long-stroke module or mover 1520 is configured to displace the short-stroke mover 1510 along with the object table 1400 over comparatively large distances. The long-stroke mover 1520 is configured to displace relative to the frame or balance mass 1530. In an embodiment, the long-stroke mover 1520 may comprise a plurality of magnets such as permanent magnets that are configured to interact with a plurality of coils that are arranged on or in the frame or balance mass 1530. An interaction between the magnets and the coils, when supplied with a current, causing the long-stroke mover 1520 to displace relative to the frame or balance mass 1530, e.g. in one or more degrees of freedom. Alternatively, the long-stroke mover 1520 may comprise a plurality of coils that are configured to interact with a plurality of magnets such as permanent magnets that are arranged on or in the frame or balance mass 1530.

In the embodiment as shown, the object table 1400 is configured to be held by the short-stroke module or mover 1510 during a displacement of the positioning device or positioner. In order to achieve this, the stage apparatus 1500 may e.g. comprise an interface assembly serving to hold the object table 1400 during normal operation, e.g. when the object table, onto which an object is loaded, is displaced. Such an interface assembly is schematically indicated in FIG. 14 by support 1540 and forces 1550. In an embodiment the supports may e.g. be protrusions arranged on either the object table 1400 or the short-stroke module 1510. Alternatively, the supports 1540 may be omitted and the object table 1400 may directly be supported on the short-stroke module 1510. The forces 1550 indicate forces, e.g. generated by a clamp such as an electrostatic or vacuum clamp, that are configured to hold the object table 1400 to the short-stroke module 1510. In an embodiment, the clamp may be integrated in the short-stroke module 1510. Alternatively, the clamp may be integrated in the object table. In an embodiment, the interface assembly is configured to substantially release the object table 1400 when a conformal loading of an object is to be performed by the object table 1400. By doing so, the object table 1400, in particular the main body of the object is allowed to deform conform an object that is to be loaded. In an embodiment, the interface assembly 1540, 1550 includes a mechanical connection connecting the object table 1400 to the short-stroke module 1510 in such manner as to allow the object table 1400 to deform as described above. The mechanical connection should thus allow an out-of-plane deformation of a holding surface of the object table 1400, to enable a conformal loading of an object. In the embodiment as shown, the stage apparatus 1500 further comprises a position measurement system, indicate by the arrow 1560, that is configured to determine a position of the short-stroke module 1510, to which the object table 1400 is mounted, and a frame 1600, e.g. a substantially stationary frame such as a reference frame. In an embodiment of the present invention, the interface assembly may e.g. include one or more struts and/or one or more springs such as leafsprings, said struts and/or leafsprings e.g. defining the six rigid body degrees of freedom of the object table. Alternatively, or in addition, the interface assembly may comprise one or more actuators that determine a position of the object table relative to the positioning device, e.g. relative to a short-stroke module of the positioning device.

In an embodiment of the present invention, the short-stroke module 1510 is omitted and the object table 1400 is directly mounted on the long-stroke module 1520. In such embodiment, an interface assembly may be applied that comprises one or more actuators that determine a position of the object table relative to the positioning device, e.g. relative to the long-stroke module of the positioning device. such actuators may e.g. include electromagnetic and/or piezo-electric actuators or the like.

In an embodiment of the present invention, an additional position measurement system may be provided for measuring the relative displacement between the bottom of the object table and the short-stroke module. In an embodiment of the present invention, the interface assembly may provide a mechanical connection which is stiff in the horizontal plane and flexible in the vertical plane, thus allowing bending of the object table, but preventing undesired movement in the horizontal plane.

In an embodiment of the present invention, there is provided a method of loading an object to an object table or a stage apparatus comprising an object table, the method comprising the steps of:

providing the object that is to be held in the vicinity of an holding surface of the object table;

deforming a main body of the object table to generate an out-of-plane deformation of the holding surface, in accordance with shape information of the object that is to be held;

exerting a holding force on the object to hold the object on the object table.

By loading and holding an object using the method according to the present invention, an object can be loaded in a conformal manner, thus avoiding or mitigating the generation of frictional stresses between the object table and the object, and the corresponding deformations of the object. By doing so, relative motion between object table and object during loading and while in contact can be avoided or mitigated such that wear of the object table and friction induced stresses and deformation of the substrate is avoided or at least mitigated.

In an alternative embodiment piezoelectric elements in the form of a remnant strain actuator may be used as actuator. The concept of remnant strain actuation is that the polarization of the piezoelectric element is changed resulting in remnant polarization changes and related remnant strains. The use of this type of actuator may be advantageous because even if no driving signal is applied to the piezoelectric element, the remnant strain remains and no active driving signal is required (i.e. the driving signal may be removed and/or disconnected) to remain the shape of the piezoelectric element. Consequently the use of remnant strain actuators may be used for (quasi-) static operation to compensate or at least mitigate for out-of-plane wafer deformation like sagging of the outer periphery of the wafer as the wafer is there not supported by burls anymore. This effect is also known as edge roll off which effect typically occurs in a timespan of a few seconds. Remnant strain actuators may however also be used to compensate or at least mitigate e.g. wear of the object table by making small adjustments within a timespan over e.g. days or weeks. Due to wear of the object table due to e.g. loading and unloading of the wafer it might be that the object table and especially burls at certain locations on the object table wear more than burls on other locations on the object table causing flatness differences over the object table.

As the amount of burls on the object table is large, exchanging all burls for piezoelectric elements and controlling the burls individually is quite cumbersome. Having a piezoelectric actuator that can be set into a new position and that remains into the new position even after removing the control signal results in a simpler control architecture. In an embodiment one or a small number of amplifiers can be switched (multiplexed) sequentially to multiple piezoelectric elements.

In an embodiment the wear of the object table can be compensated for example in the following way. First a reference or measurement wafer is loaded into the system. Via a heightmap which is measured via the level sensor it is possible to accurately measure the actual height of the supporting table and the burls. When an undesired change in height is detected, the underlying piezoelectric elements can be actuated during a height compensation cycle. In a first embodiment this can be done by loading a charging wafer which is provided with segmented charge areas. The information obtained via the measured heightmap may be converted into drive information to selectively drive the segmented charge areas such that at specific locations piezoelectric elements obtain a different height. This step may need to be repeated until the supporting table and the burls are substantially flat again. Alternatively the height of the burls may be changed to a slightly too large height but still allowable in view of accuracy requirements, by taking into account wear of the object table in the future. This is advantageous as it results in less interruption to perform such compensation steps. In an embodiment the piezo electric elements may be driven with voltage peaks in a range between 70 and 80 Volts. For this purpose the charging wafer may need to be provided with electric wiring. In an embodiment the large number of piezo actuators in the support may have one common ground electrode, keeping the table a simple structure. In an embodiment the individual addressing of actuators is realized by the segmented electrodes on the charging wafer.

In an alternative embodiment, a non-conductive wafer is electrically charged with a predetermined charge on different areas and then put onto the object table to drive the piezoelectric elements. Depending on the height differences that need compensation it might be that different areas of the non-conducting wafer are provided with different charge levels. This charging information may be based on information obtained via a measured heightmap. Charging the non-conductive wafer and putting it onto the object table may need to be repeated several times.

When a charging wafer is used the pulse peak is dependent from the dimensions of the layer thickness between the segmented voltage area and the piezoelectric elements. If the charging wafer is used mainly to compensate for edge roll off effects, the segmented voltage area can be ring formed at the outside of the charging wafer. Besides compensation of the object table, the same technology can also be used in other parts of the machine like e.g. the mask table.

Embodiments are provided according to the following clauses:

1. An object table configured to hold an object on a holding surface, the object table comprising:
   a main body;
   a plurality of burls extending from the main body, end surfaces of the burls defining the holding surface; and
   an actuator assembly,
   wherein the actuator assembly is configured to deform the main body to generate an out-of-plane deformation of the holding surface, based on shape information of the object that is to be held.
2. The object table according to clause 1, further comprising a clamp configured to exert a holding force on the object.
3. The object table according to clause 2, wherein the clamp is an electrostatic clamp comprising one or more electrodes.
4. The object table according to clause 3, wherein the one or more electrodes are arranged in or on the main body.
5. The object table according to any of the preceding clauses, wherein the actuator assembly is configured to generate the out-of-plane deformation prior to the exertion of the holding force.
6. The object table according to any of the preceding clauses, wherein the object table comprises a loading/unloading assembly configured to load the object onto the holding surface and to unload the object from the holding surface.
7. The object table according to clause 6, wherein the loading/unloading assembly comprises one or more members configured to protrude through the object table in a direction substantially perpendicular to the holding surface.
8. The object table according to any of the preceding clauses, wherein the plurality of burls are arranged on a top surface of the main body and wherein the actuator assembly is mounted to a bottom surface of the main body.
9. The object table according to clause 8, wherein the actuator assembly comprises a piezo-electric layer mounted to the bottom surface of the main body.
10. The object table according to clause 9, wherein the actuator assembly comprises a plurality of electrodes configured to cause, when energized, a deformation of the piezo-electric layer.
11. The object table according to clause 8, wherein the actuator assembly comprises a plurality of protrusions extending from the bottom surface of the main body and a plurality of piezo-electric actuators, a piezo-electric actuator of the plurality of piezo-electric actuators connecting a pair of protrusions of the plurality of protrusions.
12. The object table according to clause 11, wherein the actuator assembly comprises a plurality of electrodes configured to cause, when energized, a deformation of one or more of the plurality of piezo-electric actuators, the deformation causing a relative displacement of the protrusions.
13. The object table according to any of the preceding clauses, wherein out-of-plane deformation causes a bending of the holding surface.
14. The object table according to clause 13, wherein a neutral plane of an actuation of the object table is arranged to substantially coincide with a neutral plane of the object when subjected to a bending.
15. The object table according to any of the preceding clauses, further comprising a further actuator assembly configured to generate a further deformation of the holding surface.
16. The object table according to clause 15, wherein the further actuator assembly is configured to generate an out-of-plane deformation of the holding surface and/or an in-plane deformation of the holding surface.
17. The object table according to clause 15 or clause 16, wherein the further actuator assembly is integrated in the main body of the object table.
18. The object table according to clause 17, wherein the main body comprises a first substantially planar member onto which the plurality of burls is mounted and a second substantially planar member arranged substantially parallel to the first substantially planar member, the further actuator assembly being arranged in between the first substantially planar member and the second substantially planar member.

19. The object table according to any of clauses 15 to 18, wherein the further actuator assembly comprises a plurality of further piezo-electric actuators.

20. The object table according to any of clauses 15 to 19, wherein the actuator assembly is configured to generate a long stroke out-of-plane deformation of the holding surface and wherein the further actuator assembly is configured to generate a short stroke out-of-plane deformation of the holding surface.

21. The object table according to any of the preceding clauses, further comprising a control unit for controlling the actuator assembly.

22. The object table according to any of clauses 15 to 20, further comprising a control unit for controlling the actuator assembly and the further actuator assembly.

23. The object table according to clause 21, wherein the control unit is configured to:
receive the shape information of the object to be held, and
generate one or more control signals for the actuator assembly to generate an out-of-plane deformation of the holding surface.

24. The object table according to clause 22, wherein the control unit is configured to:
receive the shape information of the object to be held, and
generate one or more control signals for the actuator assembly and the further actuator assembly to generate an out-of-plane deformation of the holding surface.

25. The object table according to any of clauses 21 to 24, wherein the object table further comprises a sensor assembly configured to sense a shape of the object that is to be held.

26. The object table according to clause 25, wherein the sensor assembly comprises one or more proximity sensors configured to determine a proximity of the object when loaded onto the holding surface.

27. A stage apparatus comprising an object table according to any of the preceding clauses.

28. The stage apparatus according to clause 27, further comprising a positioning device configured to position the object table.

29. The stage apparatus according to clause 28, wherein the positioning device comprises a long-stroke positioner and a short-stroke positioner.

30. The stage apparatus according to clause 28 or clause 29, further comprising an interface assembly configured to hold the object table to the positioning device.

31. The stage apparatus according to clause 30, wherein the interface assembly comprises a clamp mechanism such as an electrostatic clamp.

32. The stage apparatus according to clause 31, wherein the interface assembly is integrated in the object table or the positioning device.

33. A method of holding an object by an object table, the method comprising:
providing the object that is to be held in the vicinity of a holding surface of the object table;
deforming a main body of the object table to generate an out-of-plane deformation of the holding surface, in accordance with shape information of the object that is to be held; and
exerting a holding force on the object to hold the object on the object table.

34. The method according to clause 33, further comprising deforming the main body to its initial shape when the object is held on the object table.

35. The method according to clause 34, wherein deforming the main body to its initial shape comprises reversing the out-of-plane deformation.

36. A lithographic apparatus comprising a stage apparatus according to any of clauses 27-32.

Although specific reference may be made in this text to the use of a lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. An object table configured to hold an object on a holding surface, the object table comprising:
a main body;
a plurality of burls extending from the main body, end surfaces of the burls defining the holding surface;
an actuator assembly; and
a further actuator assembly,
wherein the actuator assembly is configured to deform the main body to generate a long-stroke out-of-plane deformation of the holding surface, based on shape information of the object that is to be held and the further actuator assembly is configured to generate a short stroke out-of-plane deformation of the holding surface.

2. The object table according to claim 1, further comprising a clamp configured to exert a holding force on the object.

3. The object table according to claim 2, wherein the clamp is an electrostatic clamp comprising one or more electrodes.

4. The object table according to claim 2, wherein the actuator assembly is configured to generate the long-stroke out-of-plane deformation prior to the exertion of the holding force.

5. The object table according to claim 1, wherein the plurality of burls are arranged on a top surface of the main body and wherein the actuator assembly is mounted to a bottom surface of the main body.

6. The object table according to claim 5, wherein the actuator assembly comprises a plurality of protrusions extending from the bottom surface of the main body and a plurality of piezo-electric actuators, a piezo-electric actuator of the plurality of piezo-electric actuators connecting a pair of protrusions of the plurality of protrusions.

7. The object table according to claim 1, wherein out-of-plane deformation causes a bending of the holding surface.

8. The object table according to claim 7, wherein a neutral plane of an actuation of the object table is arranged to substantially coincide with a neutral plane of the object when subjected to a bending.

9. The object table according to claim 1, wherein the further actuator assembly is configured to generate an in-plane deformation of the holding surface.

10. The object table according to claim 1, wherein the further actuator assembly comprises a plurality of piezo-electric actuators.

11. The object table according to claim 1, further comprising a control unit configured to control the actuator assembly.

12. The object table according to claim 11, wherein the control unit is configured to:
receive the shape information of the object to be held, and
generate one or more control signals for the actuator assembly to generate an out-of-plane deformation of the holding surface.

13. The object table according to claim 1, further comprising a control unit configured to control the actuator assembly and the further actuator assembly.

14. The object table according to claim 13, wherein the control unit is configured to:
receive the shape information of the object to be held, and
generate one or more control signals for the actuator assembly and the further actuator assembly to generate an out-of-plane deformation of the holding surface.

15. The object table according to claim 1, wherein the object table further comprises a sensor assembly configured to sense a shape of the object that is to be held.

16. A stage apparatus comprising the object table according to claim 1.

17. The stage apparatus according to claim 16, further comprising a positioning device configured to position the object table.

18. The stage apparatus according to claim 17, wherein the positioning device comprises a long-stroke positioner and a short-stroke positioner.

19. The stage apparatus according to claim 17, further comprising an interface assembly configured to hold the object table to the positioning device.

20. A lithographic apparatus comprising the stage apparatus according to claim 16.

* * * * *